(12) United States Patent
Hsu

(10) Patent No.: US 7,081,382 B2
(45) Date of Patent: Jul. 25, 2006

(54) TRENCH DEVICE STRUCTURE WITH SINGLE-SIDE BURIED STRAP AND METHOD FOR FABRICATING THE SAME

(75) Inventor: Ping Hsu, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 60 days.

(21) Appl. No.: 10/720,325

(22) Filed: Nov. 24, 2003

(65) Prior Publication Data

US 2005/0054157 A1    Mar. 10, 2005

(30) Foreign Application Priority Data

Sep. 4, 2003 (TW) .............................. 92124434 A

(51) Int. Cl.
*H01L 21/8242* (2006.01)
(52) U.S. Cl. ....................................... 438/243; 438/302
(58) Field of Classification Search ................ 438/241, 438/243, 253, 302, 386, 396, 397, 514, 525
See application file for complete search history.

(56) References Cited

U.S. PATENT DOCUMENTS

| | | | |
|---|---|---|---|
| 5,936,271 A | | 8/1999 | Alsmeier |
| 6,008,104 A | * | 12/1999 | Schrems ...................... 438/386 |
| 6,291,286 B1 | * | 9/2001 | Hsiao .......................... 438/238 |
| 6,440,793 B1 | * | 8/2002 | Divakaruni et al. ........ 438/243 |
| 6,653,678 B1 | | 11/2003 | Chidambarrao et al. |

\* cited by examiner

*Primary Examiner*—Asok Kumar Sarkar
(74) *Attorney, Agent, or Firm*—Quintero Law Office

(57) ABSTRACT

A trench device with collar oxide for isolation. A buried trench capacitor is formed in a lower portion of a deep trench in a substrate. A conductive layer, surrounded by a collar insulating layer and lower than the collar insulating layer, is deposited in an upper portion of the trench. The collar insulating layer lining the trench is partially removed to expose a portion of the surface of the substrate such that a portion of the conductive layer contacts the substrate. A buried strap is formed where the substrate contacts the conductive layer, as a single-side buried strap. The other portions of the conductive layer are isolated from the substrate by the collar insulating layer. Thus, conventional shallow trench isolation (STI) structure is omitted.

22 Claims, 5 Drawing Sheets

TRENCH DEVICE STRUCTURE WITH SINGLE-SIDE BURIED STRAP AND METHOD FOR FABRICATING THE SAME

BACKGROUND OF THE INVENTION

1. Field of the Invention

The present invention relates in general to a semiconductor memory device, and more particularly, to a deep trench capacitor structure of a volatile memory cell with an improved isolation structure, and method for forming the same.

2. Description of the Related Art

A typical dynamic random access memory cell (DRAM) is composed of a switching transistor and a coupled storage capacitor. 512 MB DRAM is now widely available. There has been still an increased interest in the electronic industry for higher density and higher speed memory cell devices. Research and development efforts are made on an ongoing basis to develop faster and, correspondingly, smaller DRAM devices. Currently, conventional 2D design is gradually being replaced by 3D vertical design in DRAM fabrication. Areas transistors and capacitors occupy on a DRAM cell is greatly reduced by fabricating the capacitor in a deep trench in a semiconductor substrate, thereby minimizing the size of memory cells and power consumption and also increasing operating speeds.

FIG. 1 shows a conventional deep trench structure of a DRAM cell. As shown in FIG. 1, a deep trench (DT) 11 is formed in a p-type semiconductor silicon substrate 10. A deep trench capacitor 12 is then fabricated on the bottom portion of DT 11, which includes a buried plate 14; a node dielectric layer 16 and a storage node 18. The deep trench (DT) 11 can be conventionally formed in the p-type semiconductor substrate 10 by reactive ion etching (RIE). A high-temperature and short-term annealing process using a heavily-doped oxide material (such as arsenic silica glass (ASG)) is then performed. $N^+$ ions are diffused into the silicon substrate 10 at the lower portion of the deep trench DT 11, thus forming an $n^+$-type diffusion region 14 to serve as the buried plate of the deep trench capacitor 12. A silicon nitride liner 16 is then formed on the bottom and lower portion sidewall of the trench 11, serving as a node dielectric layer. N-doped polysilicon is deposited into the deep trench 11 and recessed to a predetermined thickness, which serves as storage node 18 of the deep trench capacitor 12.

After a deep trench capacitor 12 is formed in p-type semiconductor substrate 10, a collar insulating layer 20 is formed, lining the sidewall of the deep trench 11 above the deep trench capacitor 12, and recessed to a predetermined depth. Second and third n-doped polysilicon layers 22 and 24 are then deposited onto the deep trench capacitor 12 sequentially. One side of the third polysilicon layer and a portion of the second polysilicon are etched to form shallow trench isolation (STI) structure 26 to isolate two adjacent memory cells. Word lines $WL_1$ and $WL_2$, source/drain regions 28, a bit line contact plug (CB) and a bit line (BL) are fabricated subsequently on/in the p-type silicon substrate 10. With a thermal process, the n-type dopants in the third polysilicon layer 24 diffuse into the contiguous silicon substrate 10 from the side without collar insulating layer 20 to form a buried strap 30 that fuses to source/drain region 28 as a node junction and connects the third and second polysilicon layers 22 and 24 and the deep trench capacitor 12 in the deep trench 11.

However, seams or crystal lattice defects occur when shrinking shallow trench isolation structures, thereby reducing the reliability of memory cells.

SUMMARY OF THE INVENTION

One object of the invention is to provide a deep trench structure with single-side buried strap and a method for fabricating the same, which utilizes collar insulating layer for isolation, thereby reducing memory cell size.

Another object of the invention is to provide a deep trench structure with single-side buried strap, which utilizes collar insulating layer to replace conventional STI structures, thereby simplifying the fabrication.

To achieve these objects, a deep trench device structure and a method for making the same are provided. A deep trench is formed in a semiconductor substrate, and a buried trench capacitor is formed in the lower portion of the deep trench. A collar insulating layer is then formed lining the upper sidewall of the deep trench. A first conductive layer is deposited overlying the buried trench capacitor in the trench and surrounded by and lower than the collar insulating layer. A first portion of the collar insulating layer on the sidewall of the deep trench is then removed to expose a first portion of the semiconductor substrate while a second portion of the collar insulating layer remains to isolate a second portion of the semiconductor substrate. A second conductive layer is subsequently formed overlying the first conductive layer in the trench, wherein the second conductive layer is lower than the surface of the semiconductor substrate and a portion of the second conductive layer is isolated from the semiconductor substrate by the second portion of the collar insulating layer. Finally, a buried strap region is formed by thermal treatment in the semiconductor substrate directly in contact with the second conductive layer without isolation by the collar insulating layer.

A deep trench structure with single-side buried strap is then formed by the above method. One side of the first and second conductive layers in the deep trench is isolated from the semiconductor substrate by the collar insulating layer. The other side of the first conductive layer in the deep trench is still isolated by the collar insulating layer, but a proton of the second conductive layer on the other side of the deep trench directly contacts the semiconductor substrate. Therefore, after a proper thermal treatment, dopants in the second conductive layer can diffuse out to the contiguous semiconductor substrate, thereby forming a single-side buried strap in the semiconductor substrate. A conventional STI structure is replaced by a collar insulating layer.

A detailed description is given in the following, with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
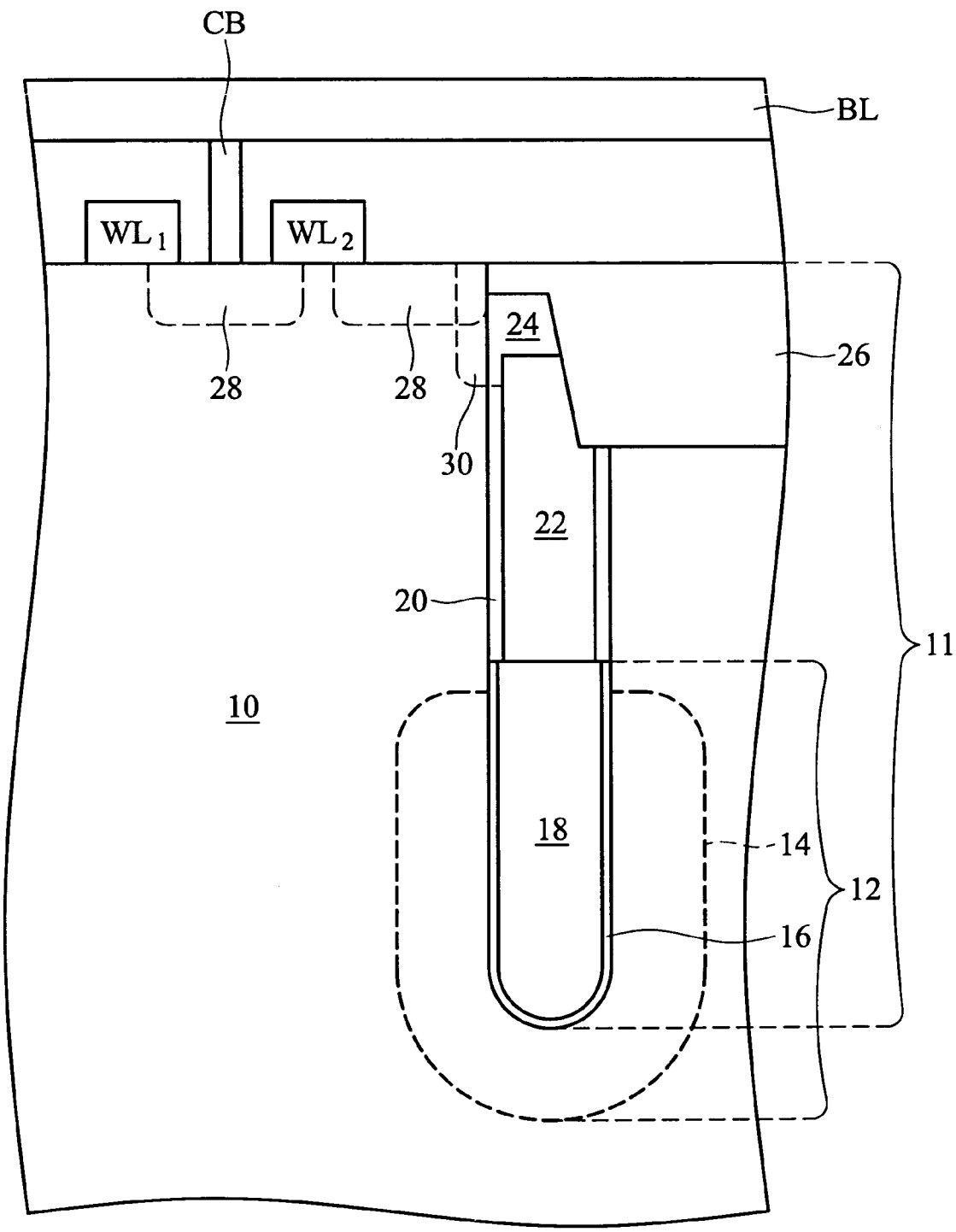
FIG. 1 shows a conventional deep trench structure of a DRAM cell.
Figure 2:
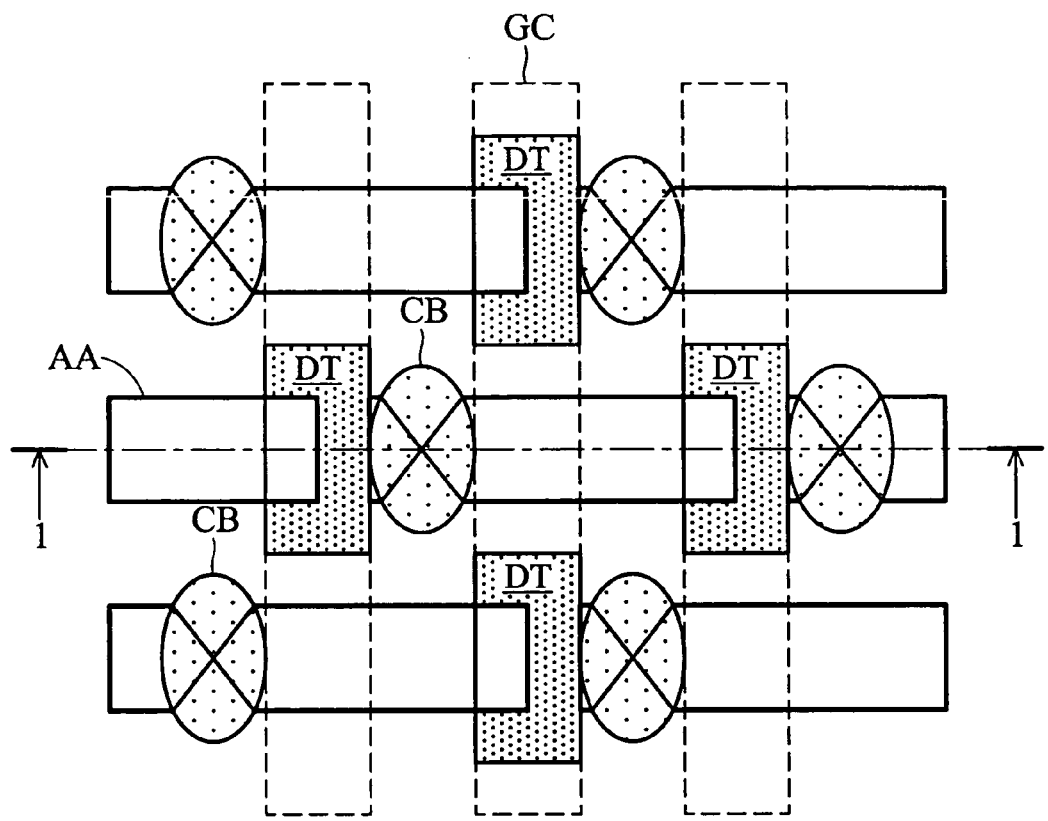
FIG. 2 shows a partial layout of a DRAM array of the invention.

FIG. 2 shows a partial layout of a DRAM array of the invention. FIGS. 3 to 8 show fabrication of a deep trench device structure with a single-side buried strap along 1—1 direction in FIG. 2.

Figure 3:
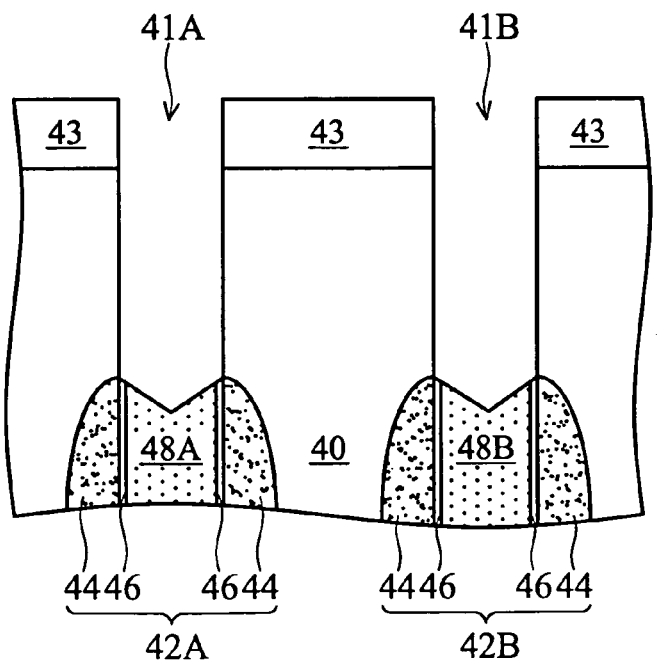
FIGS. 3 to 8 show fabrication of a deep trench device structure with a single-side buried strap along 1—1 direction in FIG. 2 of the invention.

In FIG. 3, a pad layer 43, such as a silicon nitride layer, is formed on the surface of a semiconductor silicon substrate 40. Deep trenches (DT hereinafter) 41A and 41B are formed in the silicon substrate 40. Deep trench capacitors 42A and 42B are formed in the lower portion of the deep trenches 41A and 41B respectively by conventional process as described previously. A deep trench capacitor includes a buried plate 44 in the substrate 40 surrounding the deep trench, a node dielectric layer 46 and a storage node 48. A p-type semiconductor silicon substrate 40 is exemplified hereinafter. Deep trenches (DT) 41A and 41B are formed in the substrate 40 by a patterned pad layer 41 and reactive ion etching (RIE). High-temperature and short-term annealing using a heavily-doped oxide material (such as arsenic silica glass (ASG)) is performed. N-type ions are out-diffused into the p-type semiconductor substrate 40 at the lower portion of the DT 41A and 41B to form n-doped diffusion areas 44 in the substrate 40, serving as buried plates surrounding DT 41A and 41B respectively. Lining layers 46 are then formed on the bottom and sidewalls of DT 41A and 41B respectively. The preferred layer 46 is composed of silicon nitride, oxide-nitride (ON) dual-layers, or oxide-nitride-oxide (ONO) tri-layers, and serves as a node dielectric layer. N-doped polysilicon layers 48 are deposited to fill DT 41A and 41B and then recessed to a predetermined thickness. The exposed dielectric layers 46 on the sidewalls of DT 41A and 42B are also removed, as shown in FIG. 3. The polysilicon layers 48A and 48B serve as storage nodes and the dielectric layers 46 interposed between the polysilicon layers 48A and 48B and the n-type diffusion areas 44 serve as node dielectric layers of the deep trench capacitor 42A and 42B respectively.

Figure 4:
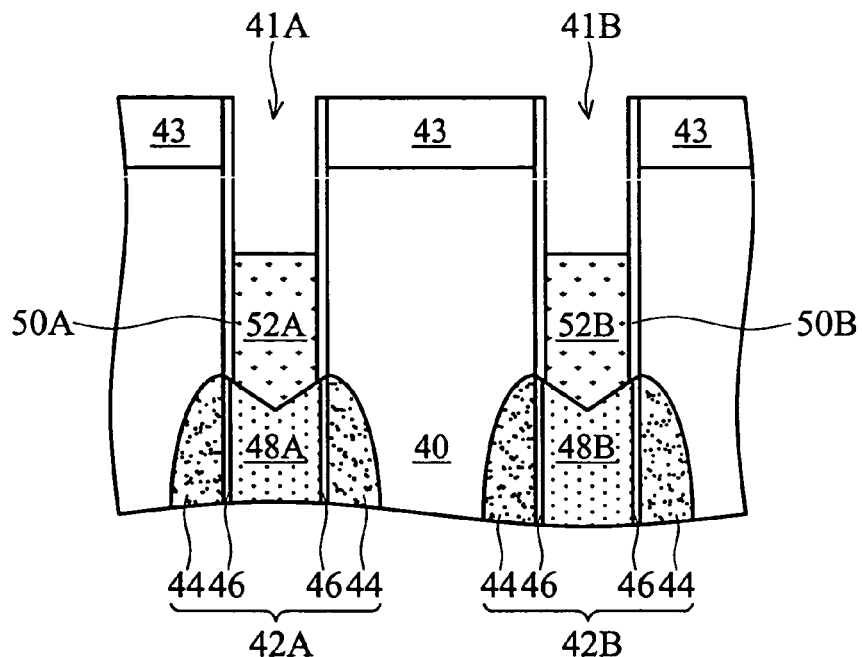

In FIG. 4, collar insulating layers 50A and 50B are formed on sidewall of DT 41A and 41B above the deep trench capacitors 42A and 42B respectively. The exposed sidewalls of DT 41A and 41B are oxidized to form silicon oxide layers. An oxide layer, such as tetra ethyle ortho silicate (TEOS), is deposited by chemical vapor deposition (CVD), conformally on the surface of the pad layer 43 and the inner surface of DT 41A and 41B at a thickness of 200 to 300 Å. The oxide layer on the surface of pad layer 43 and on the top of the deep trench capacitors 42A and 42B are removed by anisotropic dry etching, thereby forming collar insulating layers 50A and 50B on the sidewalls of DT 41A and 41B above deep trench capacitors 42A and 42B respectively, as shown in FIG. 4.

An n-type doped second polysilicon layer is deposited on the substrate 40 and fills DT 41A and 41B. Excess n-type doped polysilicon layer on the pad layer 43 is removed by chemical mechanical polishing (CMP). The n-type doped polysilicon in DT 41A and 41B are then recessed to a predetermined depth below the surface of the p-type substrate 40 as polysilicon layers 52A and 52B, as FIG. 4 shows.

Figure 5:
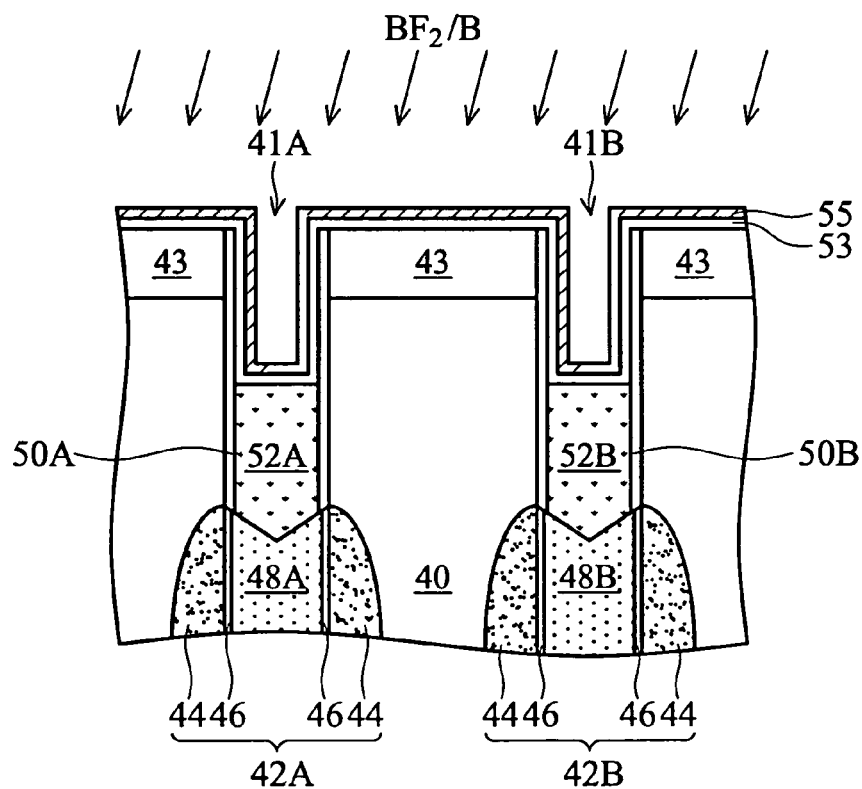

In FIG. 5, a lining layer 53 and an undoped polysilicon or amorphous silicon layer 55 are deposited conformally on the surface of the pad layer 43 and the DT 41A and 41B. Preferably, the lining layer 53 is a silicon nitride layer at a thickness of about 100 Å formed by low pressure chemical vapor deposition (LPCVD). An undoped polysilicon or amorphous silicon layer 55 is then deposited by LPCVD on the surface of the lining layer 53 at a thickness of about 50 to 100 Å. As FIG. 5 shows, the lining layer 53 and the undoped polysilicon or amorphous silicon layer 55 conformally cover the collar insulating layers 50A and 50B and the underlying polysilicon conductive layers 52A and 52B.

As further shown in FIG. 5, tilt ion implantation is performed on the undoped polysilicon or amorphous silicon layer 55 at a preferred tilt implant angle of 7° to 15°, implantation energy from 5 to 20 KeV, and with implantation dosage of $1\times10^{14}$ to $1\times10^{15}$ ions/cm$^2$. The preferred dopant is $BF_2$ or B. Due to the high aspect ratio of DT 41A and 41B, a portion of the undoped polysilicon or amorphous silicon layer 55 on the DT 41A and 41B and on the top surface of the polysilicon conductive layers 52A and 52B will be shielded and not implanted, as shown in FIG. 5. Meanwhile, the silicon nitride lining layer 53 can prevent the underlying collar insulating layers 50A and 50B from implantation and serve as a hard mask in the subsequent process.

Figure 6:
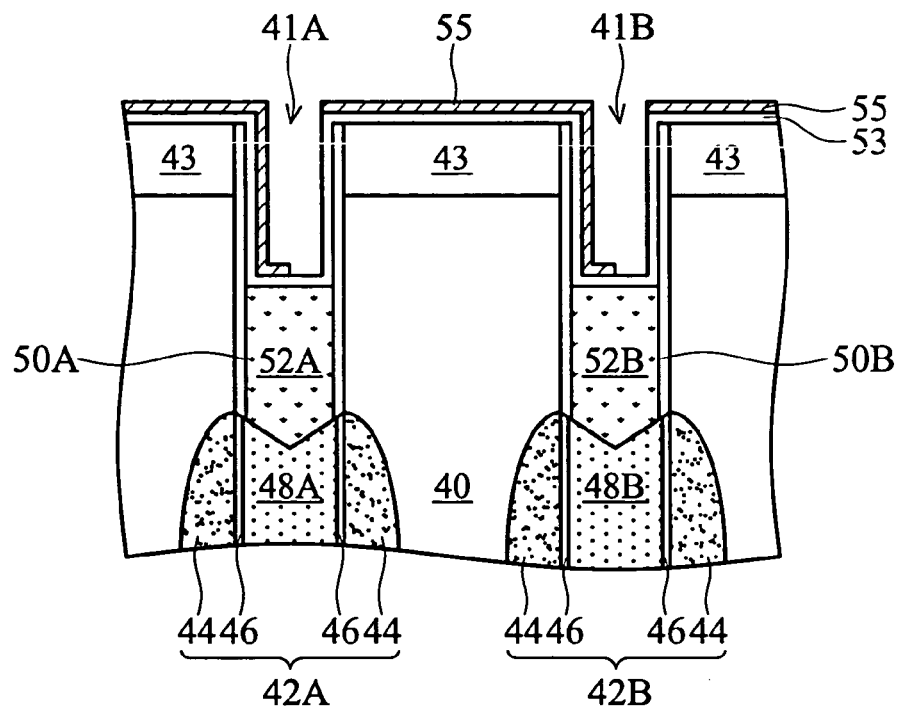

In FIG. 6, the unimplanted undoped polysilicon or amorphous silicon layer 55 is removed by selective wet etching to expose the underlying lining layer 53, with different etching rates for each. In a preferred embodiment, when $BF_2$ or B is utilized as dopant, low concentration ammonium solution is used as the selective wet etching solution. The etching rate of low concentration ammonium solution to the unimplanted n-doped polysilicon or amorphous silicon layer is much higher than that implanted. Thus, the unimplanted undoped polysilicon or amorphous silicon layer is etched to expose the underlying lining layer 53.

Figure 7:
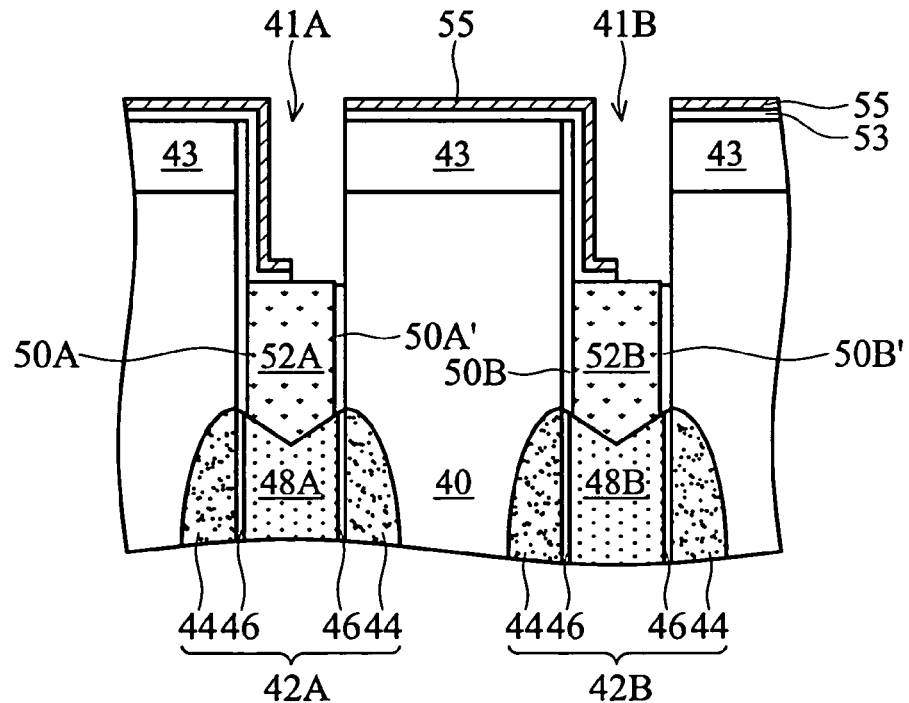

The exposed lining layer 53 is then etched with the remaining implanted undoped polysilicon or amorphous silicon layer 55 as a mask to expose collar insulating layers 50A and 50B on one sidewall of DT 41A and 41B. The exposed collar insulating layers 50A and 50B are subsequently removed with the remaining implanted undoped polysilicon or amorphous silicon layer 55 and the lining layer 53 as a mask to form lower collar insulating layers 50A' and 50B' on one sidewall of DT 41A and 41B respectively, as FIG. 7 shows. The remaining implanted undoped polysilicon or amorphous silicon layer 55 and the lining layer 53 are then removed, thereby forming DT 41A and 41B with high collar insulating layers 50A and 50B on one sidewall and lower collar insulating layers 50A' and 50B' of the opposite sidewall. As FIG.7 shows, a first portion of the collar insulating layers 50A and 50B are removed from the deep trench to form lower collar insulating layers 50A' and 50B' exposing a portion of the substrate 40. A second portion of the collar insulating layers 50A and 50B remain to form high collar insulating layers and isolate the substrate 40.

Figure 8:
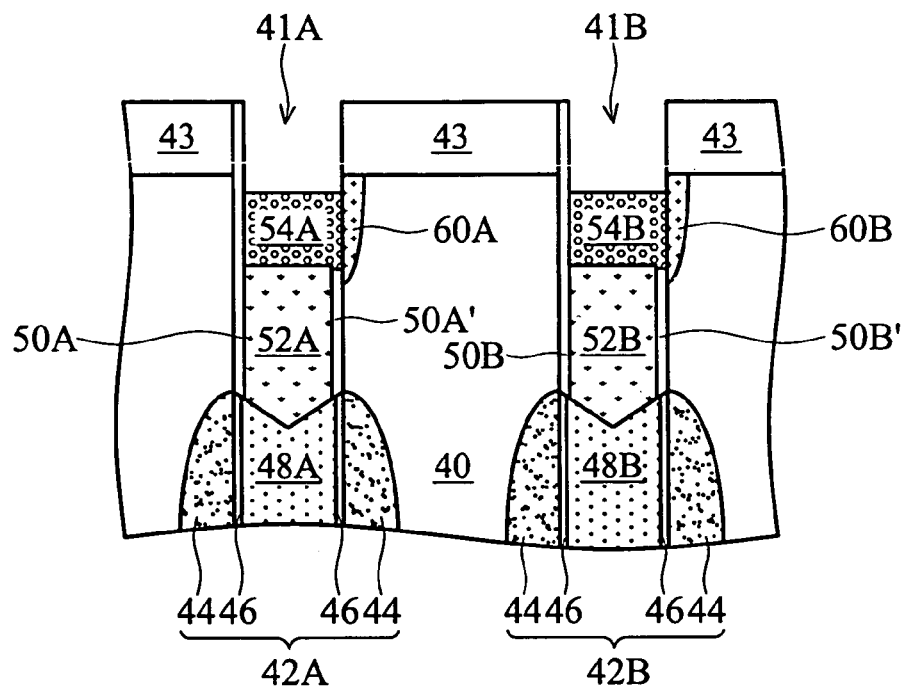

In FIG. 8, a third n-type doped polysilicon layer is deposited on DT 41A and 41B. The excess polysilicon layer on the pad layer 43 is removed by CMP. The polysilicon layers 54A and 54B in DT 41A and 41B respectively are recessed to below a predetermined surface of the substrate 40. As shown in FIG. 8, one side of polysilicon layers 54A and 54B is isolated by higher collar insulating layer 50A and 50B from the substrate 10. However, since the collar insulating layers 50A' and 50B' are lower than the polysilicon layers 54A and 54B on the opposite side, a portion of the polysilicon layers 54A and 54B directly contact the substrate 40. With an extra thermal treatment or in the subsequent thermal process, the n-type dopants in the polysilicon layers 54A and 54B will diffuse out to the p-type silicon substrate 40 without the barrier of the collar insulating layers 50A' and 50B', thereby forming single-side buried strap regions 60A and 60B in the substrate 40 adjacent to DT 41A and 41B respectively. The pad layer 43 is planarized after deep trench devices are formed.

Figure 9:
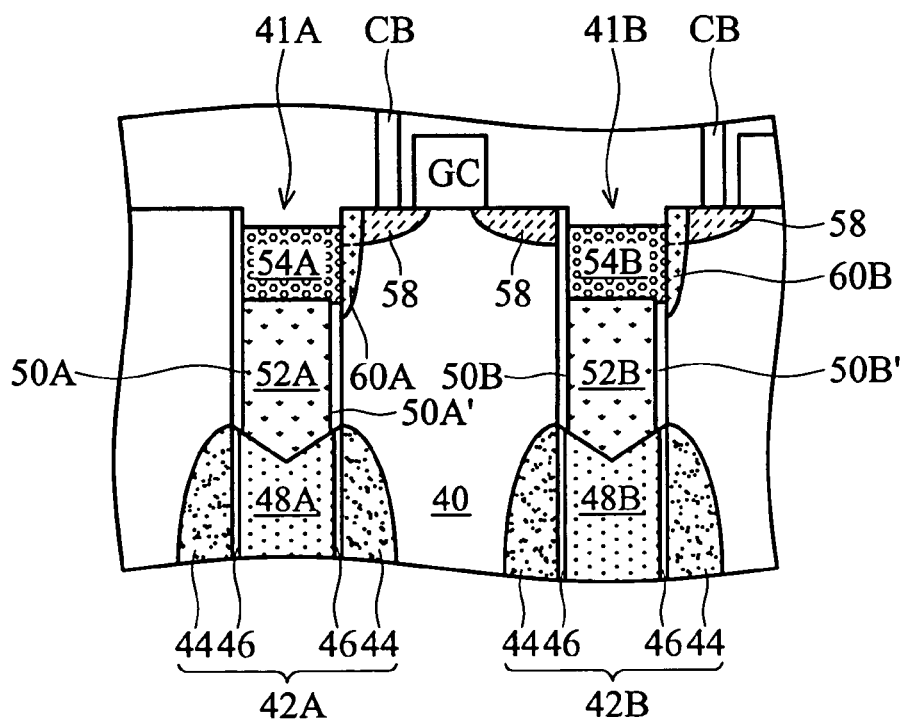
FIG. 9 is a cross-section showing a DRAM cell with a deep trench device structure with a single-side buried strap along 1—1 direction in FIG. 2, formed as shown in FIGS. 3 to 8.

FIG. 9 is a cross-section showing a DRAM cell with a deep trench device structure with a single-side buried strap along 1—1 direction in FIG. 2, formed by the above process. After deep trench device structures with single-side buried straps are formed, a gate electrode (GC), source/drain regions 58 and a bit line contact plug (BC) are formed on the surface of the semiconductor silicon substrate 40 by conventional process. As shown in FIG. 9, the single-side buried strap 60B diffuses out to contact the source/drain region 58 of the transistor, serving as a node junction to connect the polysilicon layer 54B, 52B and the underlying deep trench capacitor 42B in DT 41B. The DT 41B is isolated from the adjacent transistor by a higher collar insulating layer 50B, thereby omitting a conventional STI structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a trench device structure with a single-side buried strap, comprising the steps of:
    providing a semiconductor substrate having a deep trench therein;
    forming a buried trench capacitor in a lower portion of the deep trench;
    forming a collar insulating layer lining an upper portion of the deep trench;
    forming a first conductive layer overlying the buried trench capacitor in the trench and surrounded by and lower than the collar insulating layer by a predetermined height;
    removing a first portion of the collar insulating layer from the deep trench to expose a first portion of the semiconductor substrate while a second portion of the collar insulating layer remains to isolate a second portion of the semiconductor substrate;
    forming a second conductive layer overlying the first conductive layer in the deep trench, wherein the second conductive layer is lower than the surface of the semiconductor substrate and a portion of the second conductive layer is isolated from the semiconductor substrate by the second portion of the collar insulating layer; and
    forming the single-side buried strap region in the semiconductor substrate directly contacting the second conductive layer without isolation by the collar insulating layer.

2. The method as claimed in claim 1, removal of the first portion of the collar insulating layer from the sidewall of the deep trench further comprising:
    sequentially forming a conformal lining layer and an undoped polysilicon or amorphous silicon layer on the surface of the semiconductor substrate and inner surface of the deep trench above the second conductive layer;
    performing a tilt ion implantation on the undoped polysilicon or amorphous silicon layer, wherein a portion of the undoped polysilicon or amorphous silicon layer in the deep trench is not implanted;
    selectively wet etching the undoped polysilicon or amorphous silicon layer, thereby exposing the underlying lining layer;
    sequentially etching the exposed lining layer and the contiguous collar insulating layer to expose a portion of the semiconductor substrate using the doped polysilicon or amorphous silicon layer as a mask; and
    removal of the remaining lining layer and the doped polysilicon or amorphous silicon layer.

3. The method as claimed in claim 2, wherein the lining layer is composed of silicon nitride.

4. The method as claimed in claim 3, wherein the thickness of the silicon nitride is approximately 100 Å.

5. The method as claimed in claim 3, wherein the undoped polysilicon or amorphous silicon layer and the silicon nitride lining layer are formed by low pressure chemical vapor deposition (LPCVD).

6. The method as claimed in claim 2, wherein the thickness of the undoped polysilicon or amorphous silicon layer is between 50 and 100 Å.

7. The method as claimed in claim 2, wherein the dopant of the tilt ion implantation is $BF_2$ or B.

8. The method as claimed in claim 7, wherein the tilt angle of the ion implantation is 70° to 15°.

9. The method as claimed in claim 7, wherein the etching solution of the selectively wet etching is low concentration ammonia solution.

10. The method as claimed in claim 2, removal of the remaining lining layer and the doped polysilicon or amorphous silicon layer further comprising:
    oxidation of the remaining doped polysilicon or amorphous silicon layer; and
    sequential removal of the oxidized polysilicon or amorphous silicon layer and the underlying lining layer.

11. The method as claimed in claim 1, wherein the collar insulating layer is composed of tetra ethyle ortho silicate (TEOS) formed by chemical vapor deposition (CVD).

12. The method as claimed in claim 11, wherein the thickness of the, collar insulating layer is from 200 to 300 Å.

13. The method as claimed in claim 1, wherein the first and second conductive layers are composed of doped polysilicon.

14. The method as claimed in claim 13, wherein the buried strap region in the semiconductor substrate is formed by a thermal treatment.

15. A method of fabricating a trench device structure with a single-side buried strap, comprising the steps of:
    providing a semiconductor substrate having a pad layer thereon and a deep trench therein;
    forming a buried trench capacitor in a lower portion of the deep trench;
    forming a collar insulating layer lining an upper portion of the deep trench
    forming a first conductive layer overlying the buried trench capacitor in the trench and surrounded by and lower than the collar insulating layer by a predetermined height;
    sequentially forming a conformal lining layer and an undoped polysilicon or amorphous silicon layer on the surface of the pad layer and inner surface of the deep trench above the first conductive layer;

performing a tilt ion implantation on the undoped polysilicon or amorphous silicon layer, wherein a portion of the undoped polysilicon or amorphous silicon layer in the deep trench is not implanted;

selectively wet etching the undoped polysilicon or amorphous silicon layer, thereby exposing the underlying lining layer;

sequentially etching the exposed lining layer and the contiguous collar insulating layer to expose a portion of the semiconductor substrate using the doped polysilicon or amorphous silicon layer as a mask;

removal of the remaining lining layer and the doped polysilicon or amorphous silicon layer;

forming a second conductive layer overlying the first conductive layer in the deep trench, wherein the second conductive layer is lower than the surface of the semiconductor substrate; and performing a thermal treatment to form a buried strap region on the semiconductor substrate directly contacting the second conductive layer without isolation by the collar insulating layer.

16. The method as claimed in claim 15, wherein the lining layer is composed of silicon nitride.

17. The method as claimed in claim 16, wherein the thickness of the silicon nitride is approximately 100 Å.

18. The method as claimed in claim 16, wherein the undoped polysilicon or amorphous silicon layer and the silicon nitride lining layer are formed by low pressure chemical vapor deposition (LPCVD).

19. The method as claimed in claim 15, wherein the thickness of the undoped polysilicon or amorphous silicon layer is between 50 and 100 Å.

20. The method as claimed in claim 15, wherein dopant of the tilt ion implantation is $BF_2$ or B.

21. The method as claimed in claim 20, wherein the tilt angle of the ion implantation is 7° to 15°.

22. The method as claimed in claim 20, wherein the etching solution of the selectively wet etching is low concentration ammonia solution.

* * * * *